United States Patent [19]

Sugawara et al.

[11] 4,151,611
[45] Apr. 24, 1979

[54] POWER SUPPLY CONTROL SYSTEM FOR MEMORY SYSTEMS

[75] Inventors: Mutsuo Sugawara, Yokosuka; Keiji Namimoto, Yokohama, both of Japan

[73] Assignee: Tokyo Shibaura Electric Co., Ltd., Tokyo, Japan

[21] Appl. No.: 782,081

[22] Filed: Mar. 28, 1977

[30] Foreign Application Priority Data

Mar. 26, 1976 [JP] Japan .................................. 51-33182
Mar. 26, 1976 [JP] Japan .................................. 51-33183

[51] Int. Cl.² ............................................. G11C 7/00
[52] U.S. Cl. .................................. 365/227; 364/900; 365/229
[58] Field of Search ..................... 340/173 R; 364/200 MS File, 900 MS File, 200, 900, 492, 707; 365/189, 230, 226, 227, 228, 229; 307/238

[56] References Cited

U.S. PATENT DOCUMENTS

| | | | |
|---|---|---|---|
| 3,599,182 | 8/1971 | Henle | 365/227 |
| 3,680,061 | 7/1972 | Arbab et al. | 365/227 |
| 3,688,280 | 8/1972 | Ayling et al. | 365/227 |
| 3,703,710 | 11/1972 | Kubo et al. | 340/173 FF |
| 3,803,554 | 4/1974 | Bock et al. | 340/173 R |

*Primary Examiner*—Bernard Konick
*Assistant Examiner*—Donald McElheny, Jr.
*Attorney, Agent, or Firm*—Finnegan, Henderson, Farabow & Garrett

[57] ABSTRACT

A power supply control system for memory systems includes a power control unit for controlling the power supply for read/write operation when data is read into MOS-IC memory chips. The power control unit is constructed in such a manner that necessary power supply voltage for read/write operation is supplied to the selected memory chip during the time period when the read/write operation is executed, while no power is supplied to the non-selected memory chips.

3 Claims, 17 Drawing Figures

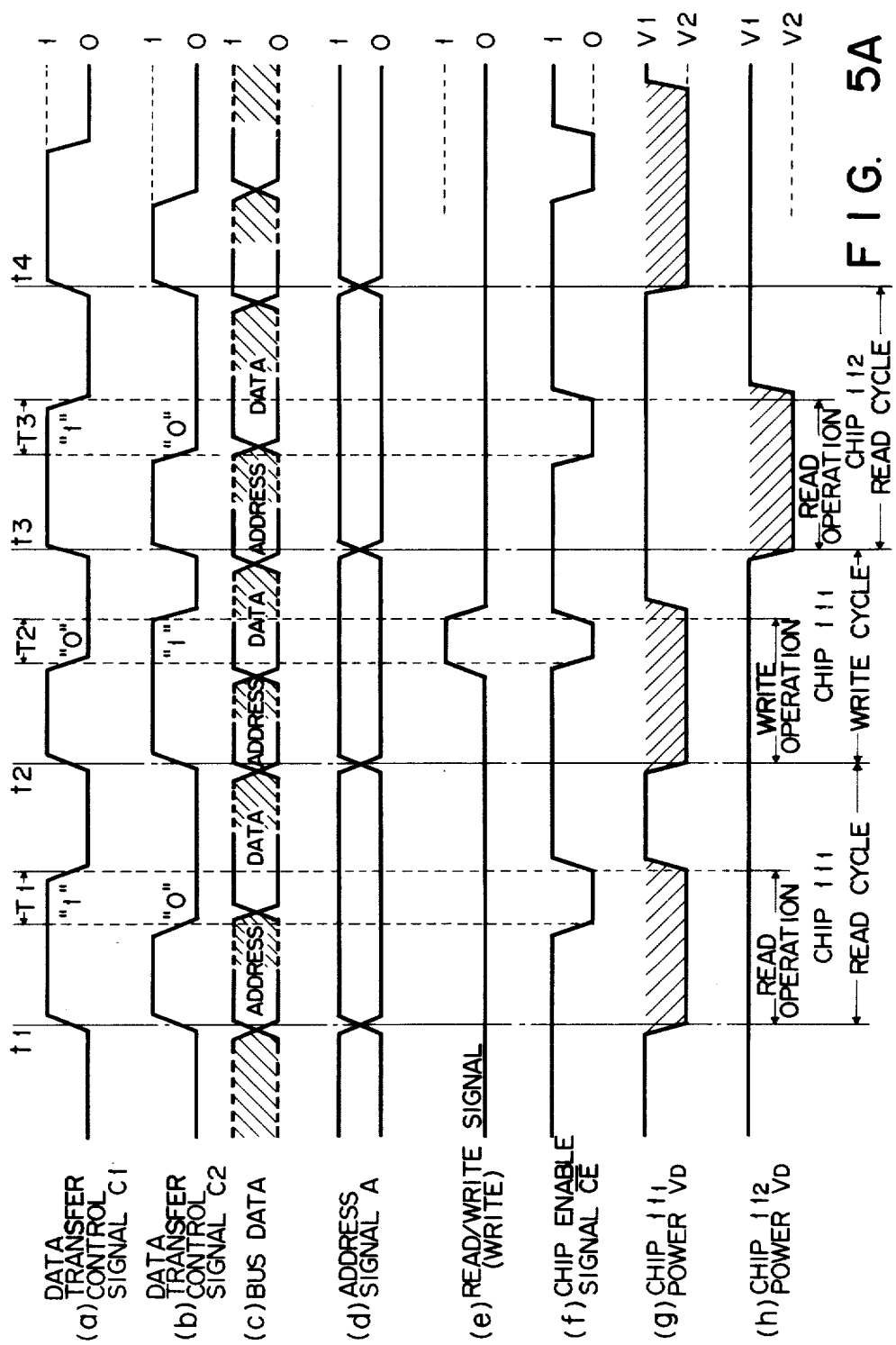

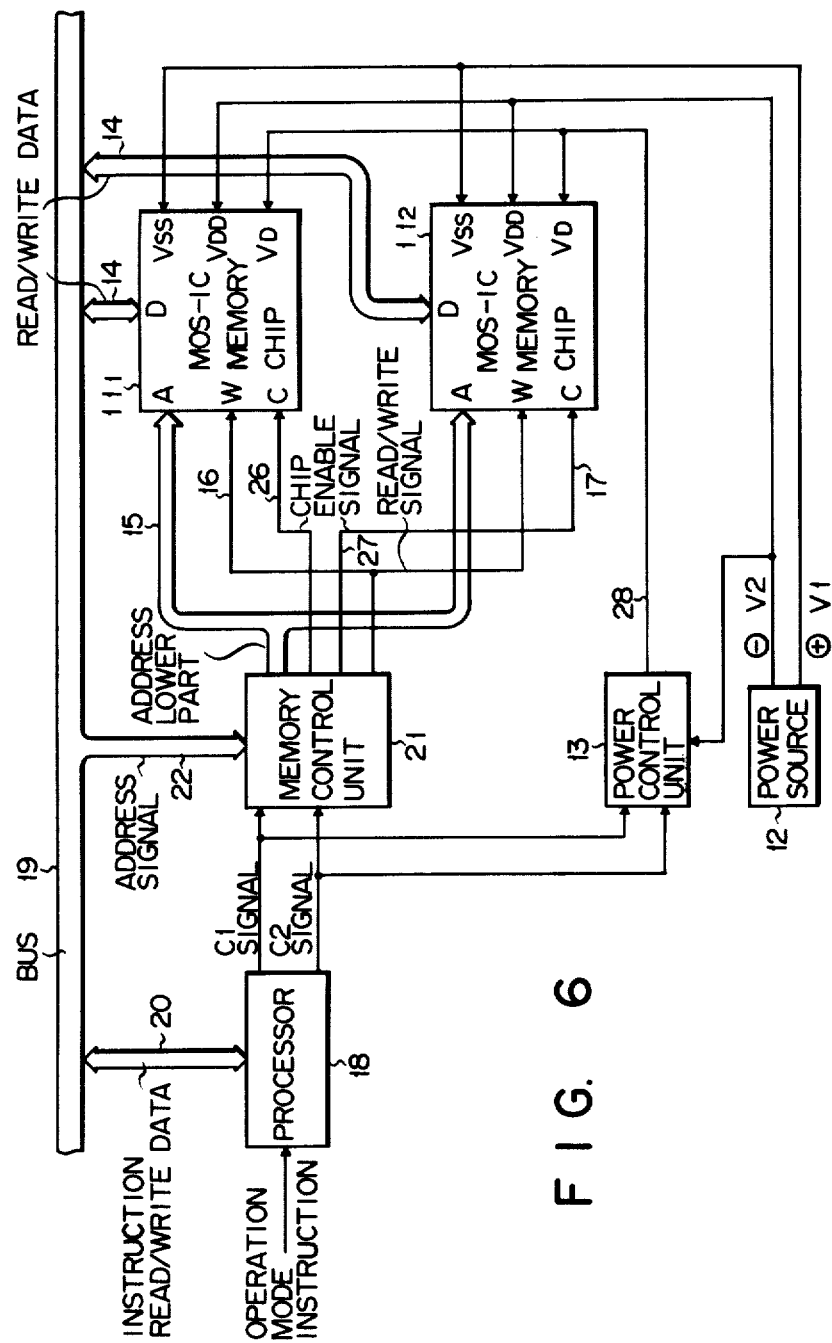
F I G. 6

F I G. 11
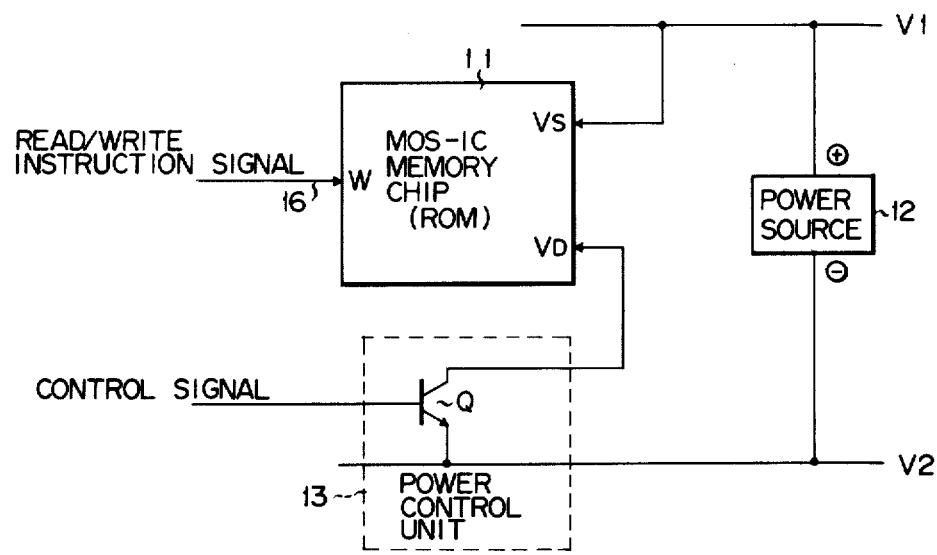
F I G. 12
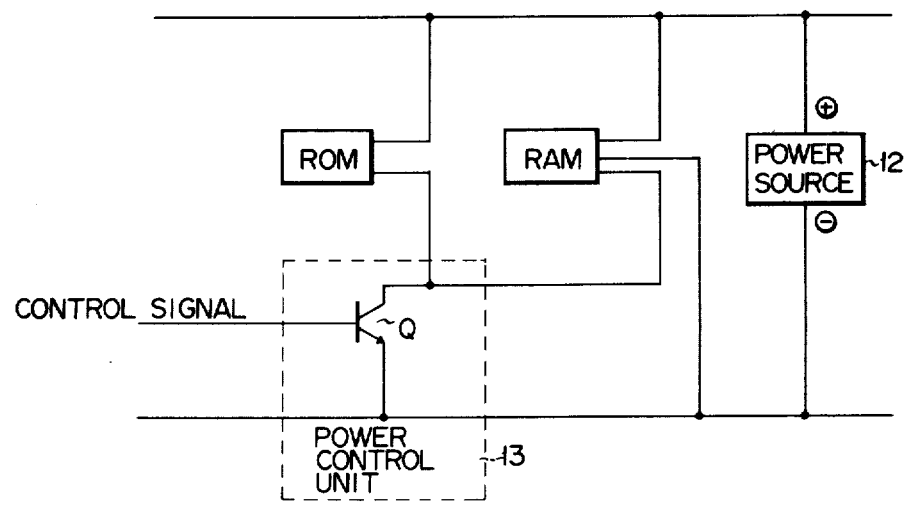

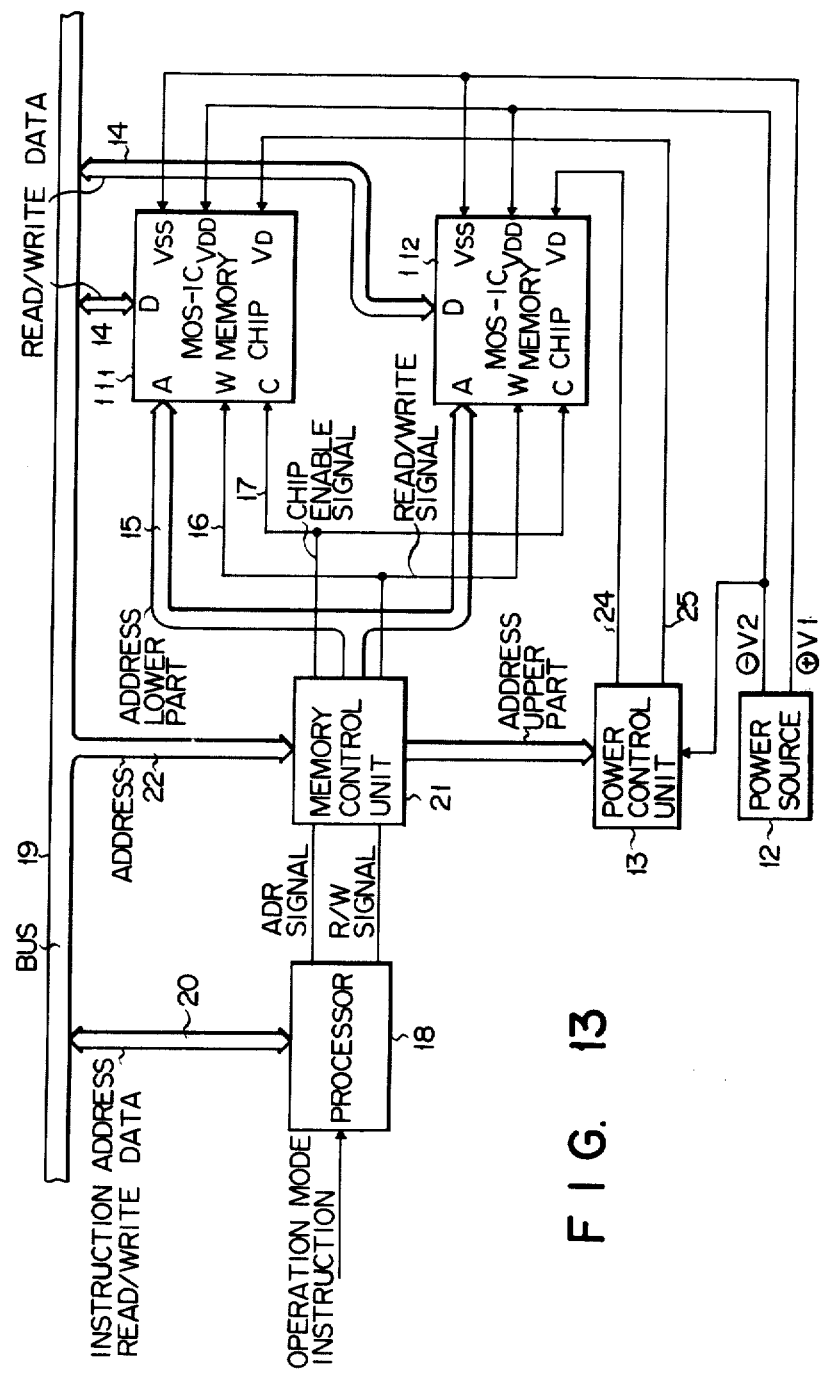
F I G. 13

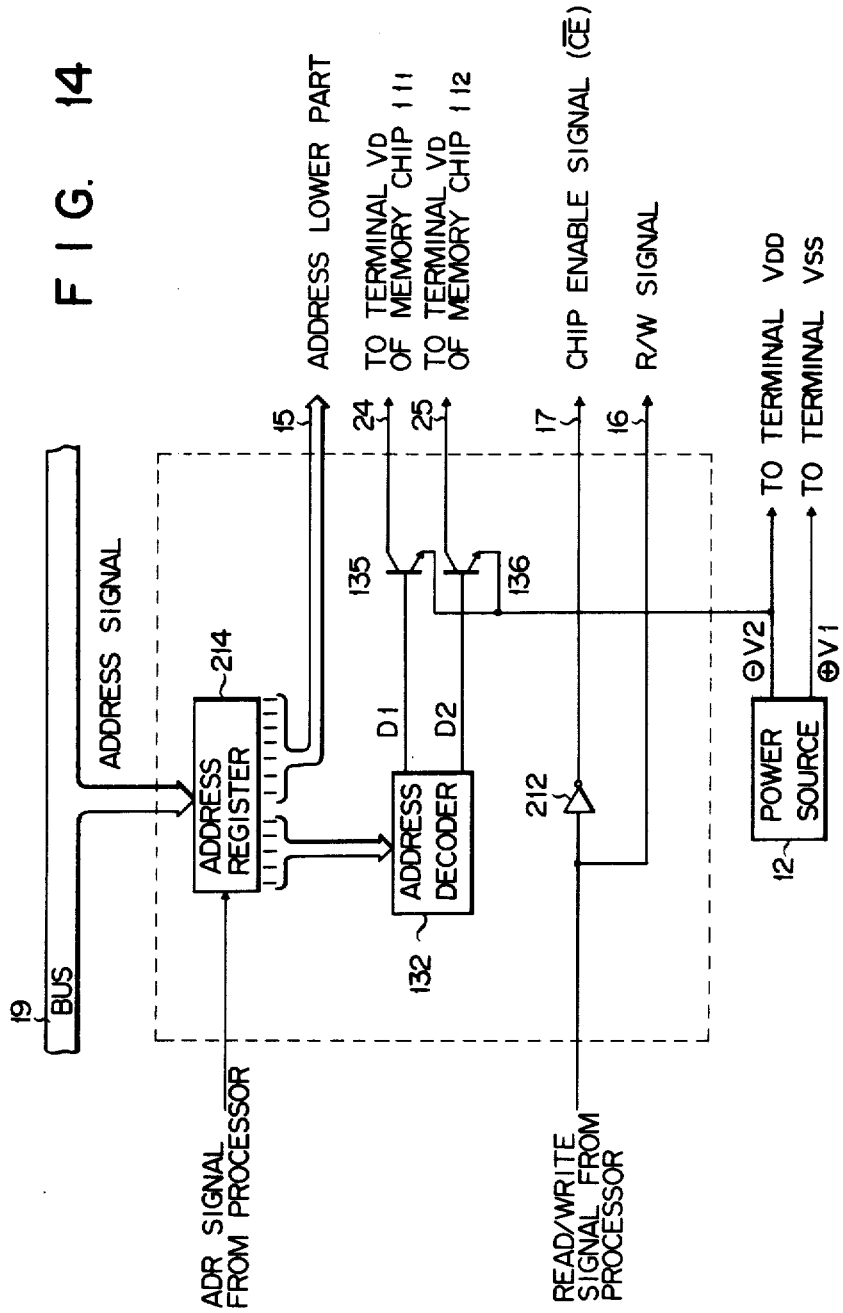

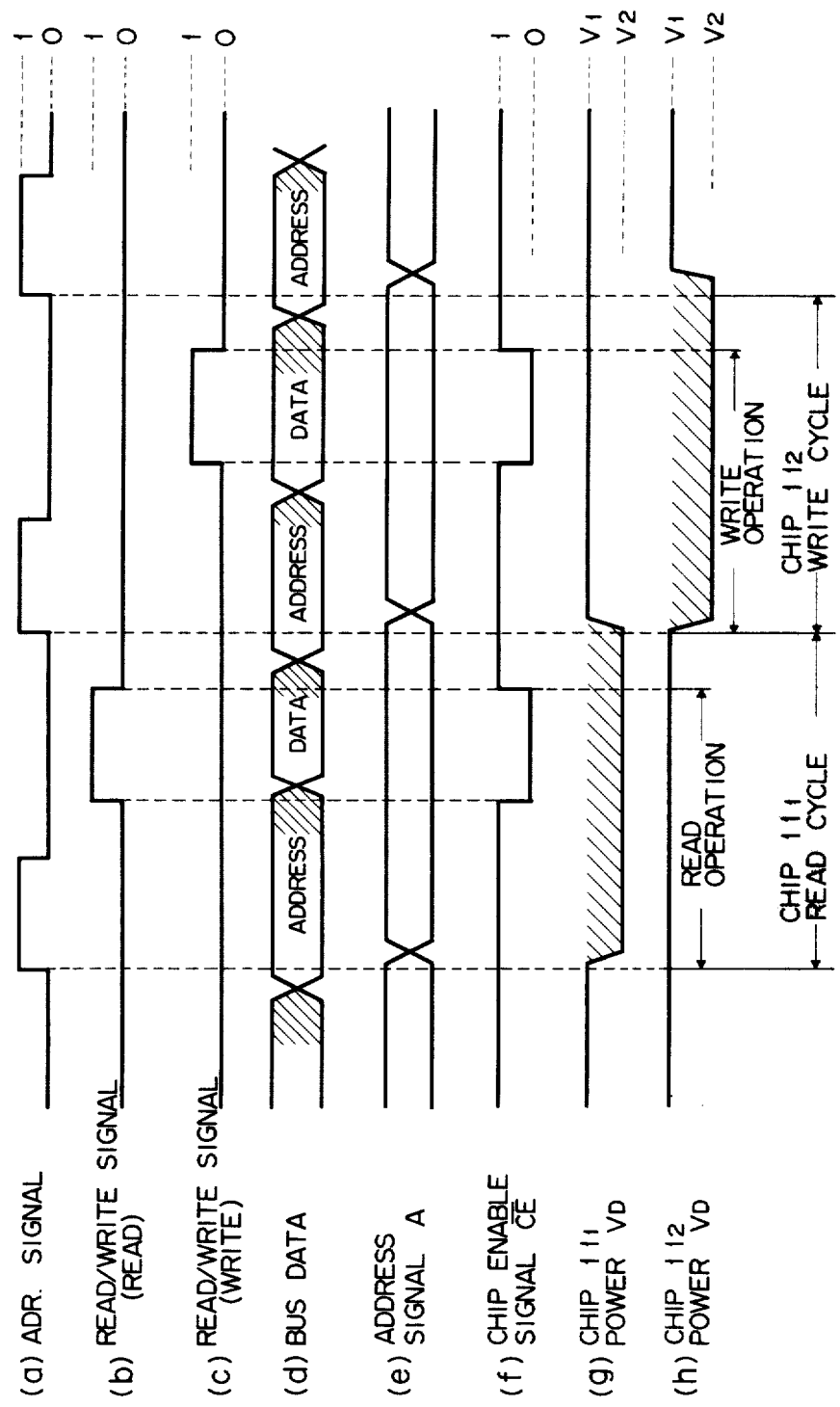

POWER SUPPLY CONTROL SYSTEM FOR MEMORY SYSTEMS

The present invention relates to a power supply control system for memory systems in which a power supply voltage for the read/write operation is applied only to a selected memory chip for which the read/write operation is to be executed.

Generally, a memory unit having a predetermined memory capacity is constituted by at least one chip of random access memory (RAM) and or read only memory (ROM). When in use, the power supply voltage is always supplied to the memory chips of the memory unit. Such power supply voltage is used, for example, for sustaining the information stored in the memory and for enabling the read/write operation with respect to the related memory.

Conventionally, the power is constantly supplied to the memory chips when the memory unit is used, thus resulting in superfluous power consumption. In the case where the stored data is kept for a long time, countermeasure taken in the past for such a problem is to stop the power supply for the read/write operation in the case of RAM, or to stop all the power supply to the memory chips of ROM.

However, this countermeasure brings about poor results of power consumption reduction. It is for this reason that most of the power dissapation in the memory unit is for read/write operation. Accordingly, the conventional way for the power consumption reduction is ineffective in the case of frequent repetition of the read/write operations. In this specification, the term read/write operation is defined as follows. That is, the read/write operation means a read operation for reading out a data from a memory and/or write operation for writing a data into the memory. The symbol $V_D$ means not only a read/write power terminal but a read/write power as well.

Accordingly, the primary object of the present invention is to provide a power supply control system for controlling the power supply to the memory.

Another object of the present invention is to provide a power supply control system in which the power necessary for the read/write operation is supplied only when data is read out of or written into the memory, thereby resulting in great reduction of power consumption.

Still another object of the present invention is to provide a power supply control system for the memory unit having a plurality of memory chips in which the power is supplied only to the memory chip selected for the read/write operation to be executed.

In a broad aspect of the present invention, there is provided a power supply control system for the memory system comprising a power source, memory means to which electric power is supplied and data is stored, and means for controlling the power supply for read or write operation for a predetermined period when data is read out of or written into the memory means.

Other objects and features of the present invention will be apparent from the following description in connection with the accompanying drawings, in which.

Figure 4A:
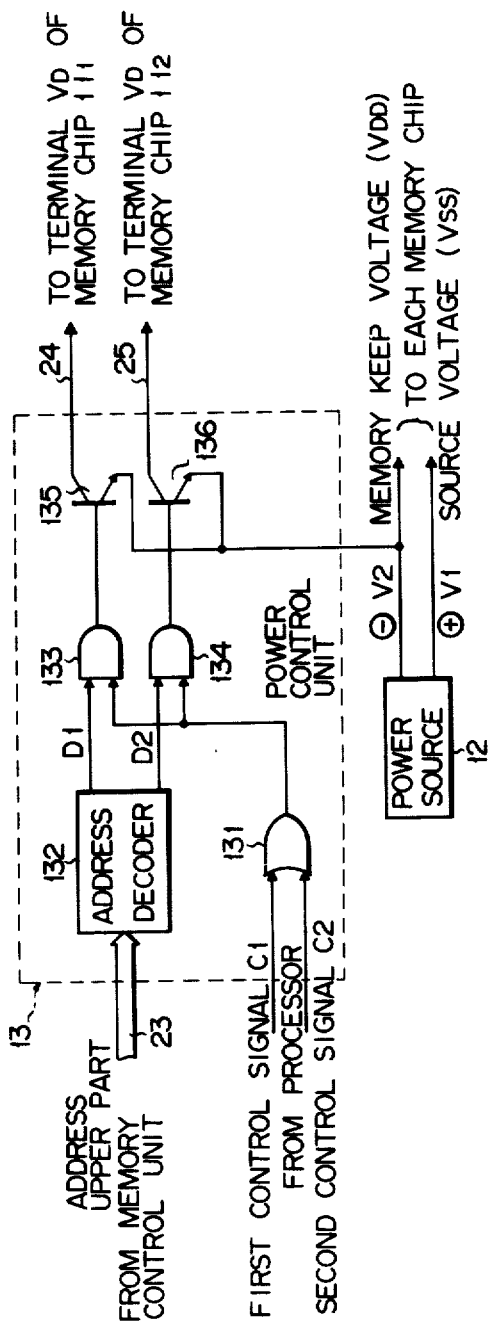
FIG. 4A is a circuit diagram of the power control unit of the FIG. 2 system.
Figure 4B:
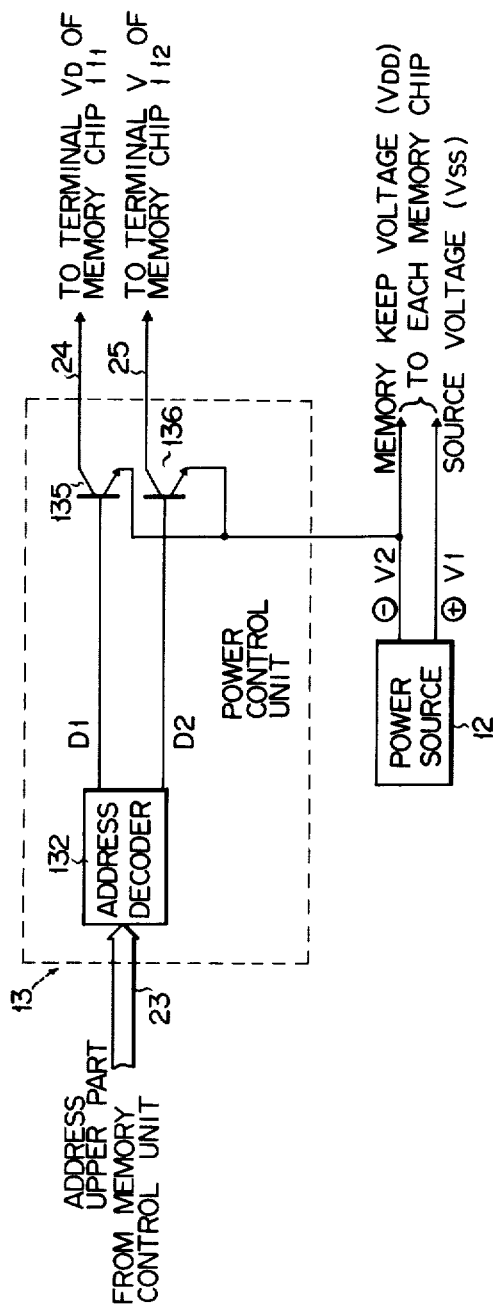
FIG. 4B is a circuit diagram of a modification of the power control unit of the FIG. 2 system.
Figure 5B:
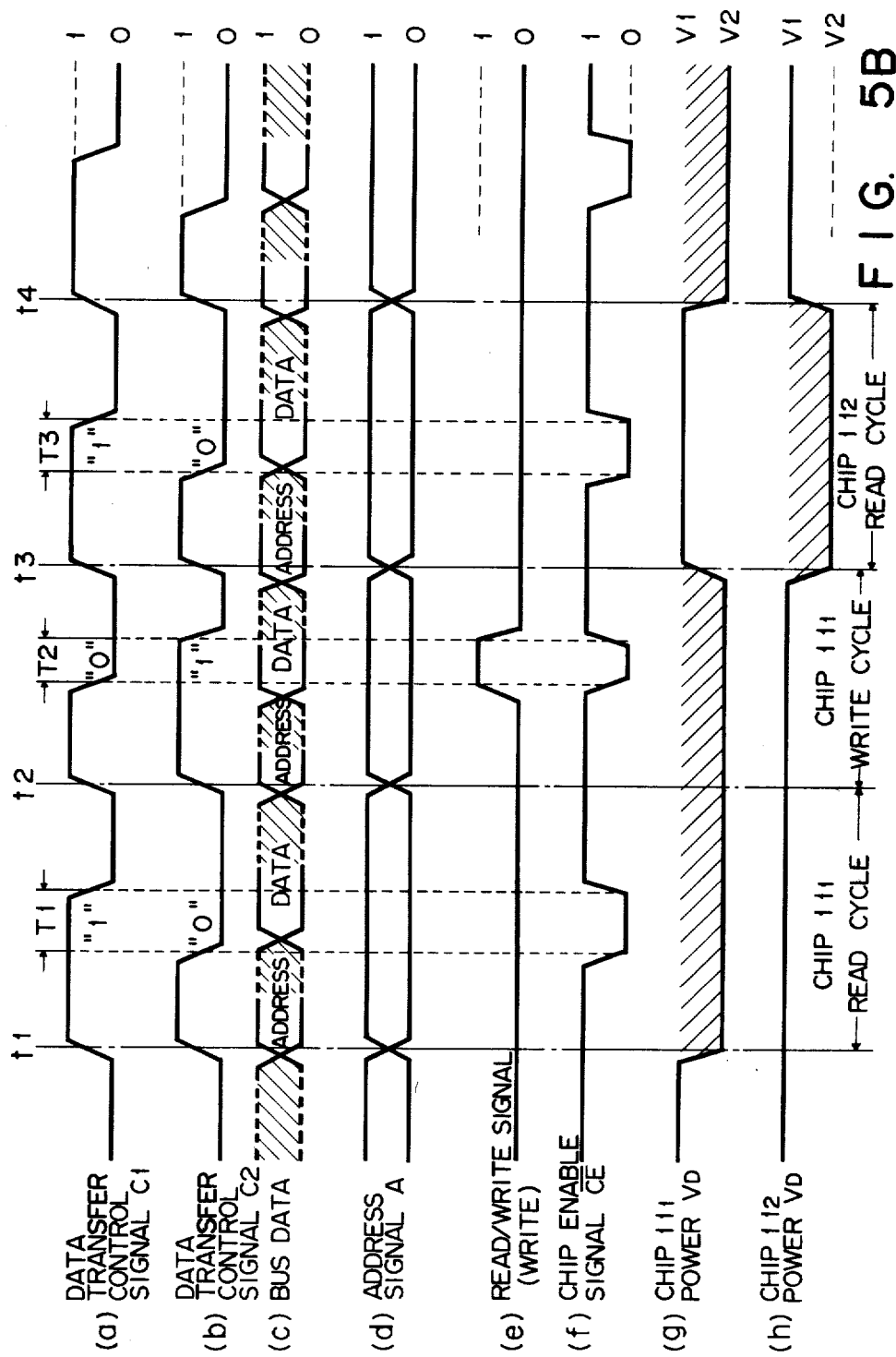
FIG. 5A is a time-chart for explaining the operations of the power supply control system of FIG. 2.
Figure 7:
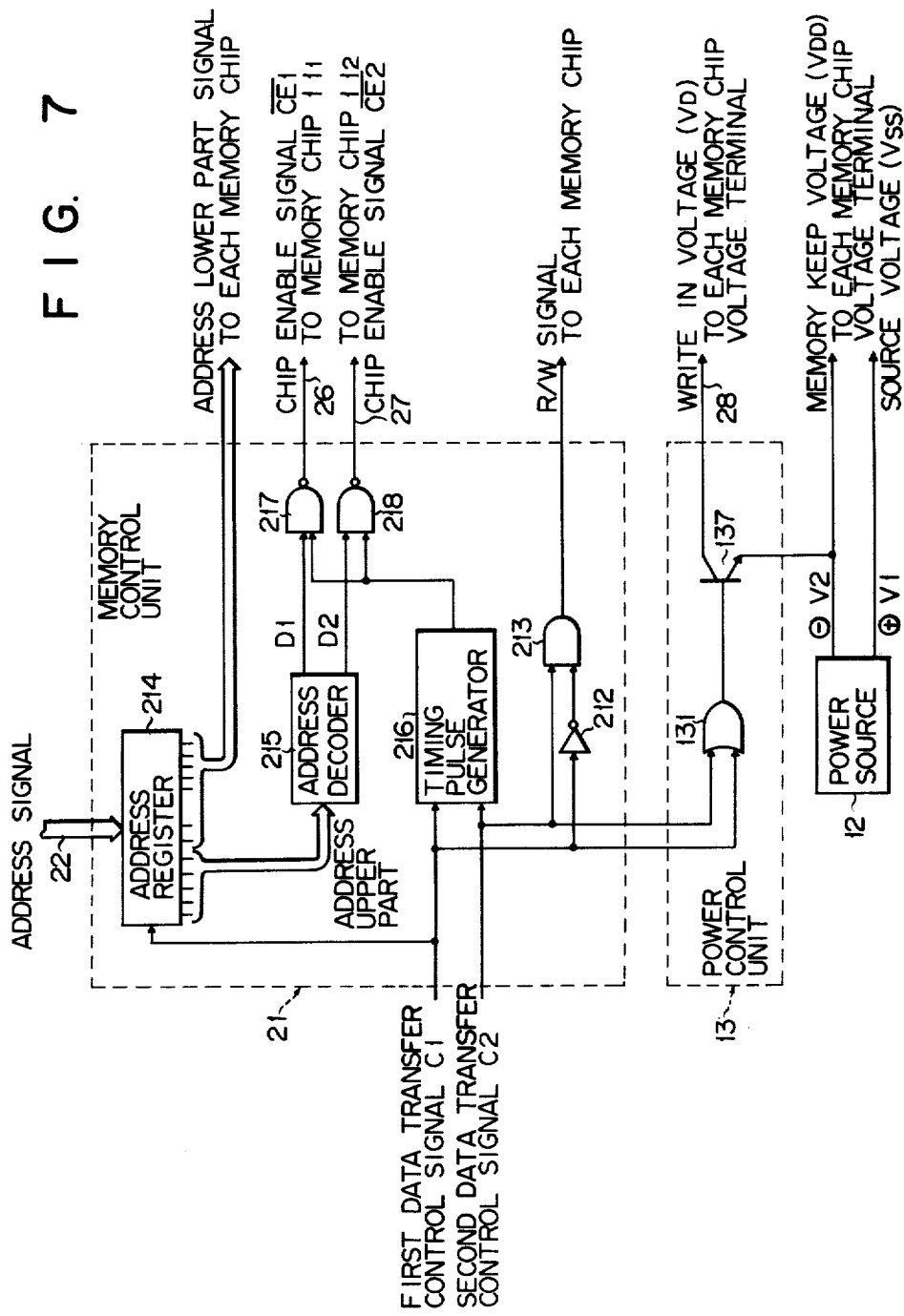
Figure 8:
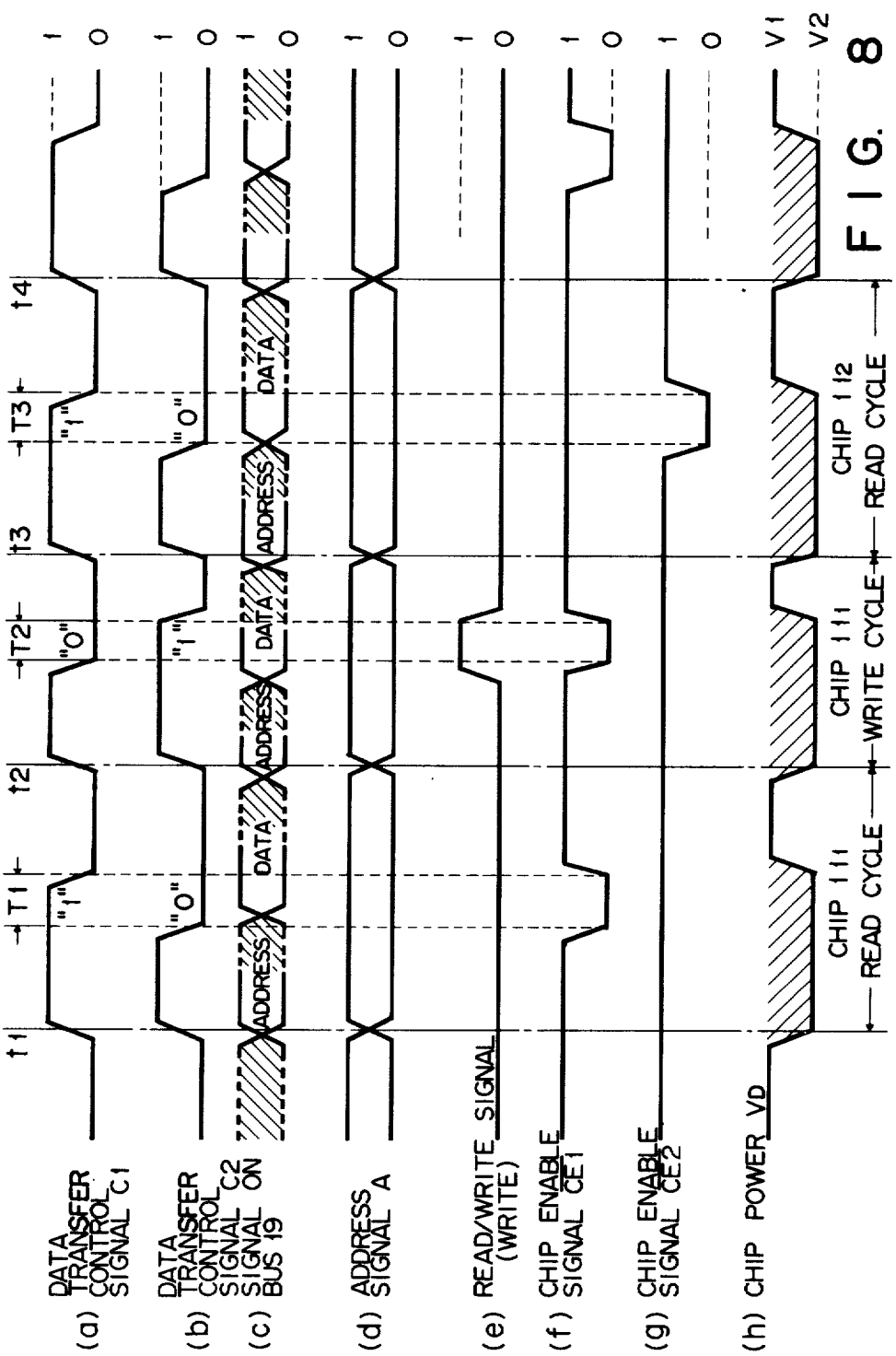
Figure 9:
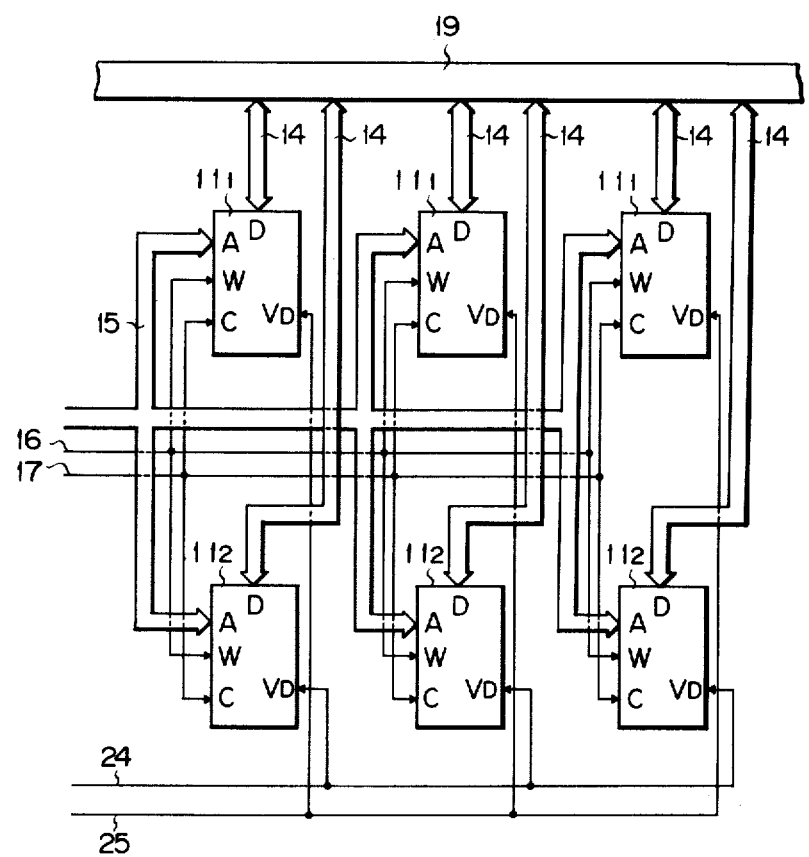

FIG. 5B, consisting of a-n, is a time-chart for explaining the operations of the power supply control system when the power control unit of FIG. 4B is used;

FIG. 6 shows a block diagram of another embodiment of the power supply control system of the present invention:

FIG. 7 is a circuit diagram of the memory control unit and the power control unit of the FIG. 6 system;

FIG. 8, consisting of a-n, is a time-chart for explaining the operations of the power supply control system of FIG. 6;

FIG. 9 is a block diagram of a part of the power supply control system which is another embodiment of the present invention.

Figure 10:
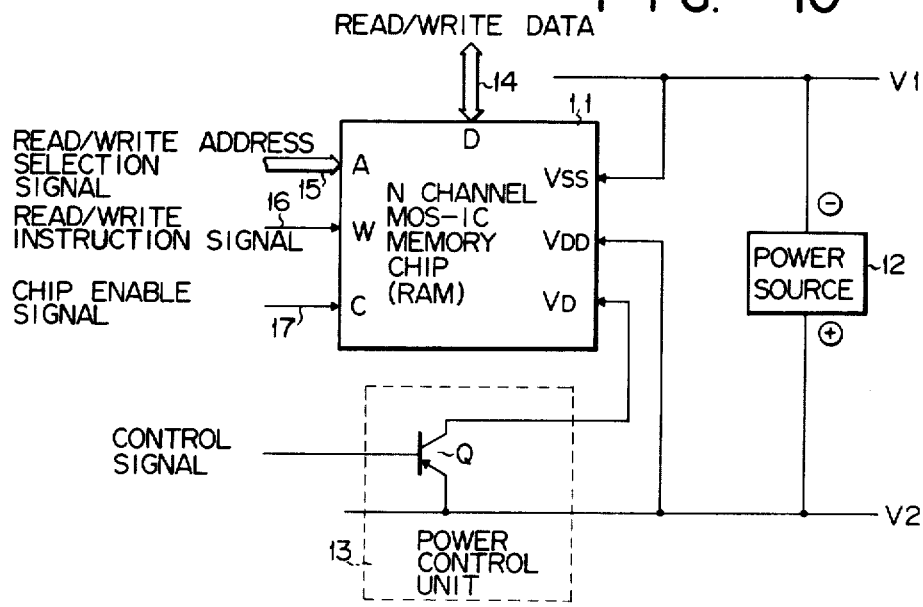

FIG. 10 is a block diagram of the power supply control system employing an n-channel MOS-IC memory chip;

FIG. 11 is a block diagram of a system using a read only memory into which the power supply control system of the present invention is incorporated;

FIG. 12 is a power supply control circuit using both the random access memory and read only memory;

FIG. 13 is a block diagram of still another embodiment of the power supply control system of the present invention;

FIG. 14 is a circuit diagram of the memory control unit and power control unit of FIG. 12; and FIG. 15, consisting of a-n, is a time-chart for explaining the operations of the FIG. 12 system.

Figure 1:
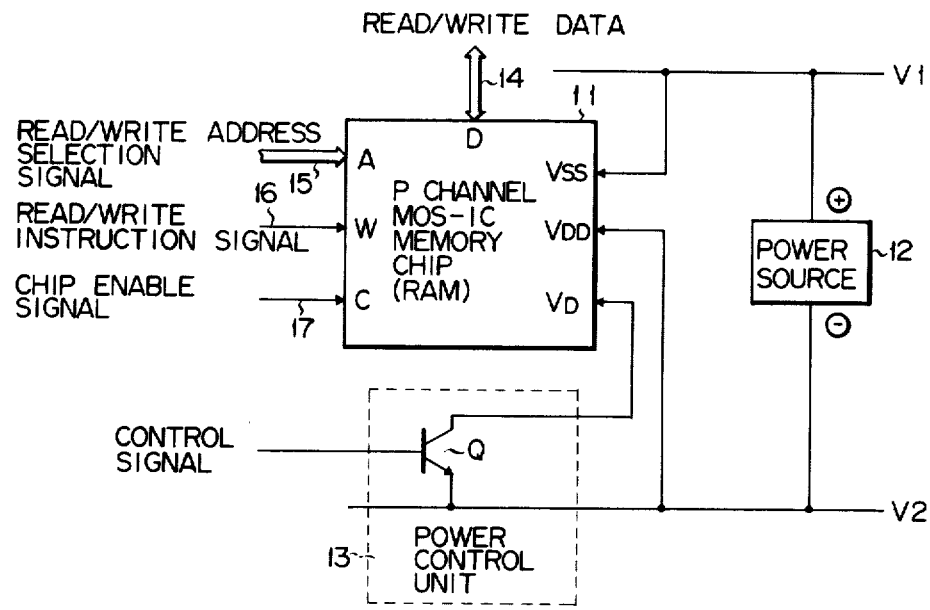
FIG. 1 shows a block diagram of a circuit for illustrating the principle of a power supply control system of the present invention.

Referring now to FIG. 1, there is shown a circuit diagram useful in explaining the principle of a power supply control system according to the present invention. In this circuit, a memory chip 11 is comprised of a random access memory (RAM) of P channel MOS-IC (metal oxide semiconductor integrated circuit) type. The power terminal at the source side (common power terminal) of the memory 11, is designated by $V_{ss}$ and the power terminals at the drain side thereof are designated by $V_D$ and $V_{DD}$. The terminal $V_D$ is used for read or write operation, while the terminal $V_{DD}$ for holding the data in the memory. To these terminals, $V_{SS}$, $V_D$ and $V_{DD}$, power is supplied from the power source 12, having the polarity as shown in the figure. During the use of the memory chip 11, the power is constantly supplied to any one of the terminals of the memory chip 11. A power control unit 13 includes a high speed bipolar type transistor circuit Q. In the read/write operation for reading out of or writing the data into the memory chip 11, the power control unit 13, upon receipt of a control signal, permits electric power from the power source 12 to be supplied to the read/write power terminal $V_D$. The memory chip 11 further includes read/write data terminals D, address terminals A, a read/write terminal W, and a chip enable terminal C. Write data is applied to the read/write terminals D. The read data read out of the memory chip 11 is delivered to data lines 14 via the terminals D. The address terminals A receive a read/write address selection signal via address lines 15. The read/write address selection signal is used to designate any one of the memory locations of the memory chip 11. To the read/write terminal W, applied is a read/write instruction signal for designating the data write instruction or the data read instruction, via an instruction line 16. The chip enable terminal C receives a chip enable signal enabling the read or write operation of the memory chip 11 via a chip enable line 17.

Incidentally, when the memory chip 11 is the read only memory (ROM), the read/write control line is unnecessary so that it is omitted. In this specification, the power source necessary for the read/write operation means the read-out or write-in power source required for the read or write operation.

When no control signal is applied to the base of the transistor Q of the power control unit 13, the transistor Q is turned off, with the result that the read/write power terminal $V_D$ is disconnected from the power line $V_2$. Therefore, the memory chip 11 fails to execute the read/write operation. On the contrary, when the control signal is applied to the base of the transistor Q, the transistor Q is turned ON so that the read/write power terminal $V_D$ of the memory chip 11 is connected with the power line $V_2$. The result is that the read/write operations is executed.

Figure 2:
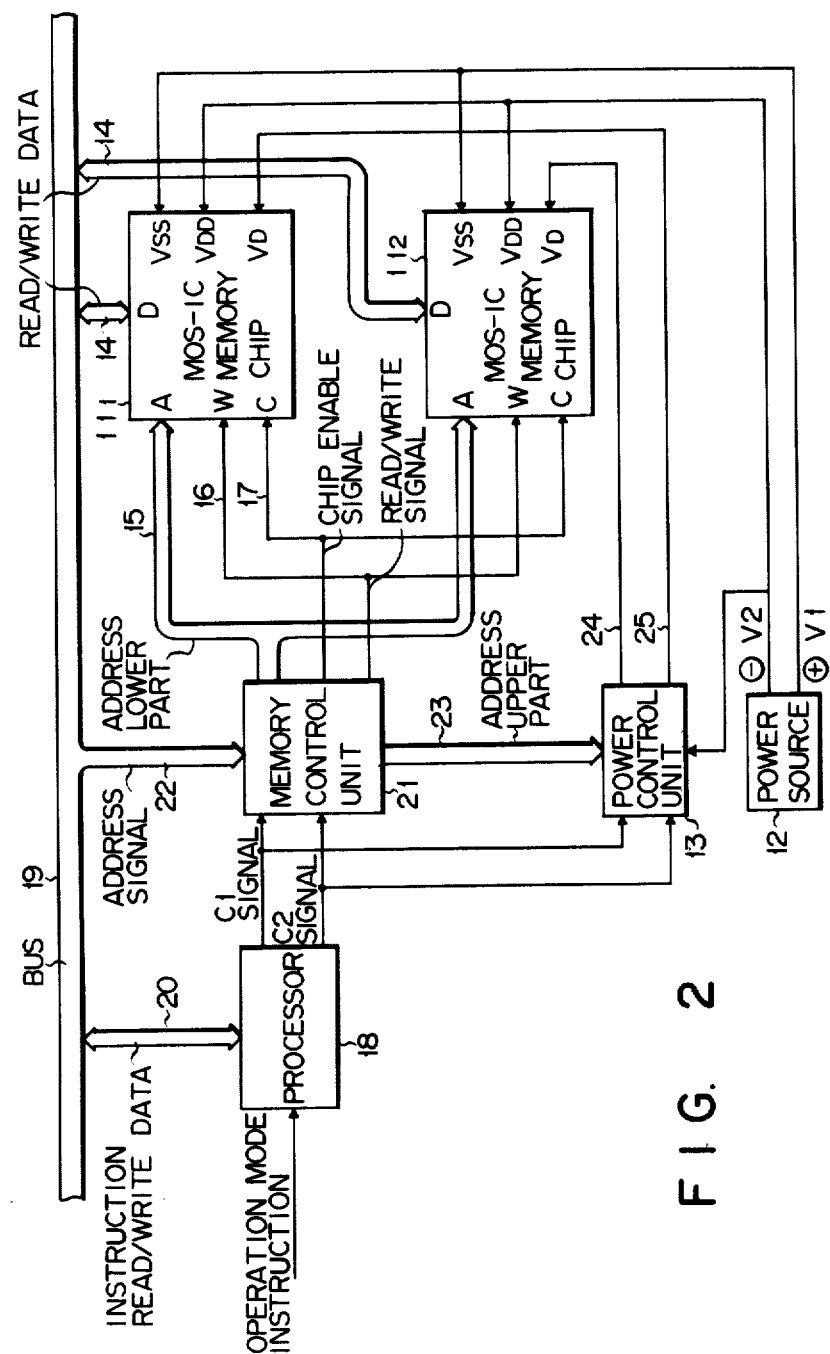
FIG. 2 shows a block diagram of a computer system into which an embodiment of the power supply control system of the present invention is incorporated.

Turning now to FIG. 2, there is shown a computer system using the power supply control circuit of FIG. 1. This is the case where the memory unit comprising, for example, two memory chips (RAM) $11_1$ and $11_2$ is controlled in the read/write operation. More than two memory chips may be used for the memory. In FIG. 2, like reference numbers are used to designate like components in FIG. 1.

In FIG. 2, the processor 18 is known in the field of computer. Upon receipt of an operation mode instruction for computer control the processor 18 issues a first and a second data transfer control signal $C_1$ and $C_2$ of the same level different in pulse widths as will be referred to in FIG. 5. The processor 18 also receives the program instruction or data fed from, for example, an input/output unit or a memory unit, through a bus 19 and an interface bus 20. On the basis of this information, the processor 18 executes an ordinary arithmetic logic operation and then transfers the result of the calculation again to the bus 19 through the interface bus 20. The operation mode instruction includes, for example, the commands of machine run and machine holt. The processor 18 feeds data transfer control signals $C_1$ and $C_2$ to the memory control unit 21. Upon receipt of data transfer control signals $C_1$ and $C_2$ and an address signal fed from the adress lines 22, the memory control unit 21 feeds commonly to the memory chips $11_1$ and $11_2$, various signals necessary for the read/write operation, a signal for designating the address in either one of the memory chips $11_1$ and $11_2$ (an address lower part), a chip enable signal enabling the memory chip and a read/write signal for designating the read or write operation mode. The memory control unit 21 delivers only address upper part for selecting one of the memory chips $11_1$ and $11_2$ in the address signal fed through the address lines 22, to the power control unit 13.

Figure 3:
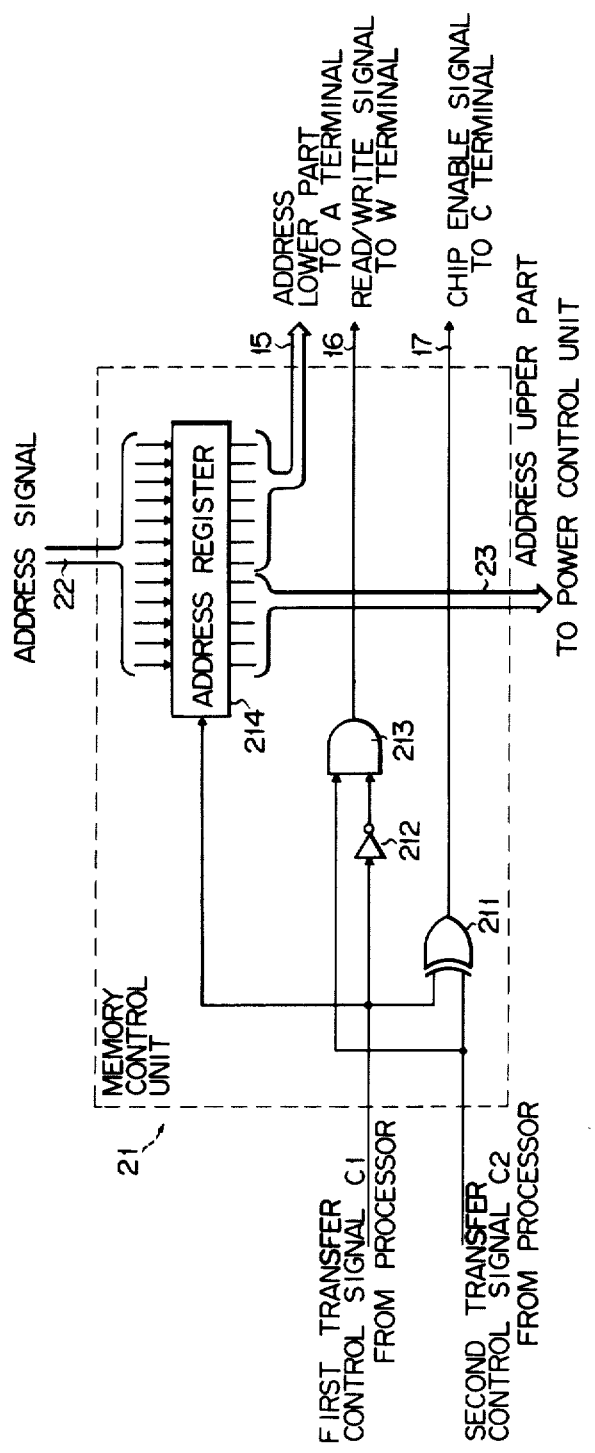
FIG. 3 is a circuit diagram of the memory control unit in the FIG. 2 system.

FIG. 3 is a circuit diagram of the memory control unit 21. The memory control unit 21 is comprised of an exclusive OR gate 211, an inverter 212, an AND gate 213 and an address register 214. The exclusive OR gate 211 receives the first and second data transfer control signals C1 and C2 and outputs the chip enable signal. The inverter 212 inverts the first data transfer control signal C1. The AND gate 213 is ANDed by the output of the inverter 212 and the second data transfer control signal C2 and outputs the read/write signal. The address register 214 stores the address signal fed through the address line 22 therein at the rising edge of the first data transfer control signal C1, and outputs the address signal (for example, consisting of 12 bits) in the divided fashion; an upper part signal of 5 bits, for example, and a lower part signal of 7 bits, for example. The address lower part signal is applied to address terminals A of each of the memory chips $11_1$ and $11_2$. The address upper part signal is applied to the power control unit 13, via address lines 23. A chip enable signal CE is fed to the chip enable terminals C of the respective memory chips.

In response to the first and second data transfer control signals C1 and C2, the power control unit 13 selects the first or second memory chip $11_1$ or $11_2$ to permit the power necessary for the read and write operation to be fed from the power source 12 to the selected memory chip, through the power line 24 and 25 respectively.

FIG. 4A illustrates in detail the circuit of the power control unit 13. The control unit 13 includes an OR gate 131, an address decoder 132, an AND gate 133, an AND gate 134, and a first and a second bipolar transistor 135 and 136. The OR gate 131 ORs the first and second data transfer control signals C1 and C2. The address decoder 132 receives an address upper part signal for memory chip selection fed through the address lines 23 from the memory control unit 21, and decodes the address upper part signal to produce a first and a second decode signal D1 and D2 corresponding to the first and second memory chips $11_1$ and $11_2$. The first AND gate 133 is ANDed by the first decode signal D1 and the output of the OR gate 131. The second AND gate 134 is ANDed by the second decode signal D2 and the OR gate 131 output. The bipolar transistors 135 and 136 are provided corresponding to the first and second AND gates and the memory chips $11_1$ and $11_2$, respectively. With such an arrangement, these transistors control the power supply for the read/write operation to the corresponding memory chip. As shown, the output of the AND gate 133 is fed to the base of the transistor 135, while the output of the AND gate 134 to the base of the transistor 136. The emitters of these transistors 135 and 136 are connected commonly to a supply terminal V2 of the power source 12. The output of the transistor 135 is connected to the read/write power terminal $V_D$ of the first memory chip $11_1$ through the power line 24, while the output of the second transistor 136 to the read/write power terminal $V_D$ of the second memory chip $11_2$ via the power line 25. The power terminals $V_{DD}$ and $V_{SS}$ of each of the memory chips $11_1$ and $11_2$ are coupled with the supply terminals $V_2$ and $V_1$ of the power source 12, respectively.

Reference will be made to FIG. 5A illustrating a set of timing diagrams useful in explaining the operation of the power control system shown in FIG. 2. Upon depression of a key by an operator, an operation mode instruction for the machine run is given to the processor 18. Then the processor 18 issues the first and second data transfer control signals C1 and C2 of a "1" level but different pulse widths, as shown in FIGS. 5A(a) (b). The data transfer for read/write is made between the respective memory chips $11_1$ and $11_2$ and the processor 18 and is controlled by the first and second data control signals C1 and C2. As shown in FIG. 5A(c), the bus 19 receives address information ADDRESS for designating the read/write address of the memory chip and data information DATA read out of or written into the memory chip.

The memory control unit 21 receives the data transfer control signals C1 and C2 shown in FIGS. 5A(a) and (b) and only the ADDRESS signal of the ADDRESS and DATA signals shown in FIG. 5A(c), and then issues designating signals necessary for the read/write operation of the respective memory chips. In the memory control unit shown in FIG. 3, the first and second data transfer control signals C1 and C2 are inputted into the exclusive OR gate 211 which in turn outputs the chip enable signal (FIG. 5A(f)) enabling the memory chip to be operable only during the time period that the read/write operation is executed. In FIG. 5A(f) the chip enable signal is labelled as an inverse chip enable signal CE. The first control signal C1 is inverted in the inverter 212 and then fed to one of the input terminals of the AND gate 213. The second data transfer control signal C2 is fed to the other input terminal of the AND gate 213. Thus, the AND gate 213 outputs the read/write signal as shown in FIG. 5A(e) for designating the read operation or write operation. For addressing the memory chip, the ADDRESS signal of, for example, 12 bits is set in the address register 214 at the rising edge of the first data transfer control signal C1, as shown in FIG. 5A(d). The lower significant bits of, for example, 7 bits of the address shift register 214 are applied as the address lower part signal to the chips, while the upper significant bits of, for example, 5 bits as the address upper part signal to the power control unit 13. The address lower part signal is used to designate the address in the memory chip and the address upper part signal for selecting the memory chip.

At the rising edges of the control signals C1 and C2, i.e. at the time when these signals rise from the logical level "0" to "1", the address signal exists on the bus 19. When the first control signal C1 is "1" and the second one is "0", i.e. during the periods of time, T1 and T3, the read operation in which the data is read from the memory chip $11_1$ to the processor 18 is executed. During the period of time T2 where the first control signal C1 is "0" and the second control signal C2 is "1", the data is written into the memory chip $11_1$ from the processor 18.

It is noted that, the first and second data transfer control signals C1 and C2 rise from the logical level "0" to "1" substantially at the same time, and no read/write operation is executed when the control signals are both in "0" level. The read/write signal W designates the write operation only when the first control signal C1 is "0" and the second control signal C2 is "1". The chip enable signal C is fed to all the memory chips.

On the other hand, the power control unit 13 receives the address upper part signal from the memory control unit 21 and decodes it in the decoder 132. The decoder 132 outputs the first decode signal D1 when the address upper part signal designates the memory chip $11_1$, while it outputs the second decode signal D2 when the address upper part signal designates the memory chip $11_2$. The decode signals D1 and D2 is ANDed by the AND gates 133 and 134, respectively together with the output of the OR gate 131 which receives the first and second control signals C1 and C2. The outputs of the AND gates 133 and 134 are applied to the bases of the first and second transistors 135. By this application, the transistor 135 and 136 is conductive, the transistor 135 permits the voltage V2 of the power source 12 to be applied to the read/write power terminal $V_D$ of the memory chip $11_1$, and, on the other hand, when the transistor 136 is conductive, the transistor 136 permits the voltage V2 of the power source 12 to be applied to the read/write power terminal $V_D$ of the memory chip $11_2$.

In FIG. 5A, the time period t1 to t2 indicates the read cycle of the memory chip $11_1$, the time period t2 to t3 indicates the write cycle of the memory chip $11_1$ and the time period t3 to t4 the read cycle of the memory chip $11_2$. Accordingly, during the period t1 to t3, the memory chip $11_1$ is selected and, as shown in FIG. 5A(g), the power is applied to the power terminal $V_D$ of the memory chip $11_1$ only during the shadowed period. During the period t3 to t4, the memory chip $11_2$ is selected and, as shown in FIG. 5A(h), the power is applied to the power terminal $V_D$ of the memory chip $11_2$ only during the shadowed period. When both the control signals C1 and C2 are "0", no voltage is applied to the power terminals $V_D$ of the memory chips $11_1$ and $11_2$. In the abovementioned embodiment of the present invention, one of features of the power control system resides in that, through the operation of the power control unit 13, the memory chip corresponding to the address information is selected and supplied with the power supplied with for read/write operation, and another feature is that such power is not applied when the control signals C1 and C2 are both "0" during the read/write cycle of the selected memory chip. Therefore, power consumption of the memory unit is greatly reduced.

The power control unit 13 shown in FIG. 2 may be constructed as the circuit shown in FIG. 4B. As seen from the figure, OR gate 131 and AND gates 133 and 134 are removed from the circuit of FIG. 4A. The address upper part signal through the address line 23 is applied to the address decoder 132 where it is decoded and the address decoder produces predetermined decode signals D1 or D2. The decode signal makes the transistor to be selected conductive thereby to supply the power to the memory chip selected for read/write operation.

FIG. 5B is a set of timing charts for explaining the operation of the power control system using the power control unit of FIG. 4B. As shown in FIGS. 5B(g) and (h), when the memory chip $11_1$ is selected, the power is applied to the memory chip $11_1$, while, when the memory chip $11_2$ is selected, the power is applied to the memory chip $11_2$. In other words, the power supply control system using the power control unit shown in FIG. 4B supplies the power to only the memory chip selected in the memory unit having a plurality of memory chips, the power being necessary for the read and write operation.

Referring now to FIG. 6, there is shown another embodiment of the power supply control system according to the present invention. In the figure, like numerals are used to designate like portions in FIG. 2 of which the explanation will be omitted. The first difference of the example from the FIG. 2 embodiment is that the memory control unit 21 issues the first and second chip enable signals CE1 and CE2 which in turn are applied to the first and second memory chips $11_1$ and $11_2$ via the first and second chip enable lines 26 and 27, thereby selecting the memory chip for which the read/write operation is to be performed. The second difference is that the power control unit 13 permits the read/write power from the power source 12 to be applied commonly to the read/write power terminals $V_D$ of the memory chips $11_1$ and $11_2$, through the power line 28.

FIG. 7 shows a detail of the memory control unit 21 and the power control unit 13 shown in FIG. 6. As shown in FIG. 7, the memory control unit 21 is comprised of an address register 214, an address decoder 215, a timing pulse generator 216, first and second NAND gate circuits 217 and 218, an inverter 212, and an AND gate 213. The address register 214 stores signal for designating the address of the memory chip at the rising edge of the first data transfer control signal C1 and produces the address lower part signal for designating the address of the memory chip and the address upper part signal for selecting a memory chip. The address decoder 215 decodes the address upper part signal fed from the address register 214 and produces the first and second decode signals D1 and D2 corresponding to the memory chips $11_1$ and $11_2$. The timing pulse generator 216 receives the first and second data transfer control signals C1 and C2 and generates timing pulses for designating the timing of the chip enabling signal generation. The first and second NAND gates 217 and 218 make are connected to respectively the first and second decode signals D1 and D2 together with the timing pulses from the timing generator 216 to produce the chip enable signals CE1 and CE2 corresponding to the memory chips $11_1$ and $11_2$. The inverter 212 inverts the first data transfer control signal C1. The AND gate 213 makes the logical product of the output of the inverter 212 and the second control signal C2 to produce the read/write signal.

The power control unit 13 comprises an OR gate 131 connected to receive the first and second data transfer control signals C1 and C2, and a high speed bipolar transistor 137, in response to the output of the OR gate 131, for supplying the voltage necessary for the read/write operation from the power source 12 commonly to the respective memory chips $11_1$ and $11_2$.

FIG. 8 is a set of timing charts for illustrating the operation of the power control system of FIG. 6. The period t1 to t2 corresponds to the read cycle of the memory chip $11_1$, the time period t2 to t3 to the write cycle of the chip $11_1$, and the period t3 to t4 to the read cycle of the memory chip $11_2$. The address signal fed via the address line 22 is stored in the address register 214. The upper significant bits (address upper part) of the address register 214 is decoded in the decoder 214 to produce either decode signal D1 or D2. Assuring now that the decoder 214 produces the decode signal D1, the decode signal D1 is fed to the AND gate 217, and AND gate 217 is enabled when the timing pulse from the timing pulse generator 216 is applied to the same, and then the NAND gate 217 produces the chip enable signal CE1 as shown in FIG. 8(f). The chip enable signal CE1 is applied to the memory chip $11_1$ through the first chip enable line 26, with result that the memory chip $11_1$ is conditioned operable. On the other hand, in the power control unit 13, the transistor 137 is made conductive by the first and second data transfer control signals C1 and C2 through the OR gate 131. As a result, the voltage V2 from the power source 12 is applied commonly to the memory chips $11_1$ and $11_2$ through the power line 28 only during the period of time when the logical sum of the control sigbals C1 and C2 is "1" (the shadowed portion of FIG. 8(h)). Accordingly, during the period T1, the data is read out from the memory chip $11_1$ addressed to be transferred to the bus 19 through the data line 14. During the period T2, since the read/write signal is "1" as shown in FIG. 8(e), the data from the processor 18 is loaded into the memory chip $11_1$ addressed, through the bus 19. During the period T3, since the chip enable signal CE2 is produced as shown in FIG. 8(g), the data is read out of the memory chip $11_2$. As shown in FIG. 8(h), the read/write power $V_D$ is supplied from the power source 12 to the memory chips $11_1$ and $11_2$ only during the shadowed portions, i.e. when the first and second data transfer control signals C1 and C2 are "1". Consequently, in the power control system in FIG. 6, no power is supplied to the memory chip when the read/write operation is not performed in the read/write cycle of the memory with the result that the power consumption is considerably reduced.

While the examples of FIGS. 2 and 6 use two memory chips, the similar power control is applied to the power supply control system with one or three or more memory chips by using the power lines or the chip enabling lines corresponding to number of memory chips used. In this case, if the bit number constituting each word of the memory is insufficient with the bit number of one chip, the bit number may be increased by connecting a plurality of memory chips in parallel, as shown in FIG. 9. In this case, the power line 25 is connected to the memory chips $11_1$, and the power line 24 is applied to the memory chips $11_2$. In this way, as in the previous case, the power supply control may be performed to each set of three memory chips.

Turning now to FIG. 10, there is shown another example of the present invention in which the memory chip of N channel MOS-IC is used. In this case, inverse of the polarity of the power source 12 and conductivity type of the transistor 12 is needed for obtaining the same power supply control. While RAM is used in the above-mentioned examples, ROM may also be used for the power supply control system of the present invention. The programmable read only memory PROM also may be used likewise. The example using the ROM is shown in FIG. 11. In the cases using the ROM and PROM, the data holding power source $V_{DD}$ is unnecessary; however, when the data is read out of the memory chip, the read-out power $V_D$ is necessary. Thus, as in the previous cases, the power supply control may be performed by the power control unit 12. As shown in FIG. 12, the present invention is applicable to the memory unit including RAM and ROM. The memory may be arranged with at least one memory unit including a plurality of memory chips.

The power control unit is not limited to the circuits shown in FIGS. 2 and 6, but may be constituted by the circuit comprising the transistor transistor logic (TTL).

The high speed bipolar transistor circuit so used in the power control unit 12 is that, in a high speed read/write control operation, connection or disconnection of the power $V_D$ may be made smoothly. The power control circuit is not limited to such bipolar transistor circuit, if the circuit is operable at a high speed. The data transfer control signals C1 and C2 shown in FIGS. 2 and 6 may be substituted by the address designating signal ADR, the read signal READ, and the write signal WRITE with different frequencies, as shown in FIG. 13. In the figure, like reference numerals designate like parts in the previous cases. The processor 18 produces the address designating signal ADR and the read/write signal. The memory control unit 21 and the power control unit 13 may be constructed by the circuit as shown in FIG. 17. The timingg charts of this circuit is shown in FIG. 15. As shown in FIG. 15(a), when the ADR signal is "1", the address information from the processor 18 appears on the bus 19. As shown in FIG. 15(b), when the read signal is "1", the memory chip 11₁ and delivers the read data on the bus 19. When the write signal is "1" as shown in FIG. 15(c), the processor 18 outputs the write data on the bus line 19. If such the signals the address designating signal and the read/write signals are used, the power supply voltage for the read/write operation is supplied to the memory chip selected by the address signal.

What we claim is:

1. A memory system comprising:
a plurality of semiconductor chips each having address terminals to which an address signal is applied to designate a memory location therein, data terminals to which is applied a data signal which is written into the designated memory location or is read out of the designated memory location, a chip enable terminal to which is applied a chip enable signal during which a read operation or write operation is performed, memory content holding power supply terminal to which a power supply voltage is normally applied to hold memorized content of memory chips and a read/write power supply terminal to which a power supply voltage necessary for read/write operation is applied;
a power supply connected to the memory content holding power supply terminal of each of said memory chips;
bus means for transferring an address signal including a first part signal designating a memory location of said memory chips and a second part signal for selecting one of said memory chips;
processor means for producing first and second data transfer control signals each taking successively a first voltage level and a second voltage level and specifying a first memory addressing state in which the first and second control signals are at the first voltage level, a second read/write operation execution state in which one of the first and second control signals is at the first voltage level and the other is at the second voltage level and a third idle state in which the first and second control signals are at the second voltage level, said states following in succession during a read or write cycle;
means connected to said bus means and responsive to the first state of the first and second control signals to apply the first part signal of said address signal to the address terminals of each of said memory chips and responsive to the second state of the control signals to apply the chip enable signal and the read/write control signal respectively to the chip enable terminal and the read/write control terminal of each of said memory chips; and
means responsive to the first and second states of the first and second control signals and the second part signal of the address signal to couple said power supply to the read/write operation power supply terminal of a memory chip selected by the address signal only during the first and second states of the first and second control signals.

2. A memory system comprising;
a plurality of semiconductor memory chips each having address terminals to which an address signal is applied to designate a memory location therein, data terminals to which is applied a data signal which is written into the designated memory location or is read out of the designated memory location, a chip enable terminal to which is applied a chip enable signal during which a read operation or write operation is executed; memory content holding power supply terminal to which a power supply voltage is normally applied to hold memorized contents of said memory chips and a read/write power supply terminal to which a power supply voltage necessary for read/write operation is applied;
a power supply connected to the memory content holding power supply terminal of each of said memory chips;
bus means for transferring an address signal including a first part signal designating a memory location of said memory chips and a second part signal for selecting one of said memory chips;
processor means for producing first and second data transfer control signals each taking successively a first voltage level and a second voltage level and specifying a first memory addressing state in which the first and second control signals are at the first voltage level, a second read/write operation execution state in which one of the first and second control signals is at the first voltage level and the other is at the second voltage level dependent on the read or write operation, and a third idle state in which the first and second control signals are at the second voltage level, said states following in succession during a read or write cycle;
means connected to said bus means and responsive to the first state of the first and second control signals to apply the first part signal of the address signal to the address terminals of each of said memory chips, and responsive to the second state of the control signals to apply the chip enable signal and the read/write control signal to the chip enable terminal and the read/write control terminal of each of said memory chips, respectively; and
means responsive to the second part signal of the address signal to couple said power supply to the read/write power supply terminal of a memory chip selected by the second part signal of the address signal during the first, second and third states of the control signals during a read or write cycle.

3. A memory system comprising:
a plurality of semiconductor memory chips each having address terminals to which an address signal is applied to designate a memory location therein, data terminals to which is applied a data signal which is written into the designated memory location or is read out of the designated memory location, a chip enable terminal to which is applied a chip enable signal during which a read operation or write operation is executed, a memory content holding power supply terminal to which a power supply voltage is normally applied to hold memorized contents of said memory chips and a read/write power supply terminal to which a power supply voltage necessary for read/write operation is applied;
a power supply connected to said memory content holding power supply terminal of each of said memory chips;
bus means for transferring an address signal including a first part signal designating a memory location of said memory chips and a second part signal for selecting one of said memory chips;

processor means for providing first and second data transfer control signals each taking successively a first voltage level and a second voltage level and specifying a first memory addressing state in which the first and second control signals are at the first voltages level, a second read/write operation execution state in which one of the first and second control signals is at the first voltage level and the other is at the second voltage level dependent on the read or write operation, and a third idle state in which the first and second control signals are at the second voltage level, said states following in succession during a read or write cycle;

means responsive to the first state of the first and second control signals to apply the first part signal of the address signal to said address terminals of each of said memory chips, responsive to the second state of the control signals and the second part signal of the address signal to apply the chip enable signal to said chip enable terminal of a memory chip selected by the second part signal of the address signal, and to the second state of the control signals to apply the read/write control signal to said read/write control terminal of each of said memory chips; and means responsive to the first and second states of the first and second control signals to couple said power supply to said read/write power supply terminal of each of said memory chips.

* * * * *